United States Patent
Kyotani et al.

(10) Patent No.: US 8,440,476 B2
(45) Date of Patent: May 14, 2013

(54) METHOD FOR PRODUCING ZINC OXIDE-BASED SEMICONDUCTOR LIGHT-EMITTING DEVICE AND ZINC OXIDE-BASED SEMICONDUCTOR LIGHT-EMITTING DEVICE

(75) Inventors: Chizu Kyotani, Tokyo (JP); Naochika Horio, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 364 days.

(21) Appl. No.: 12/882,430

(22) Filed: Sep. 15, 2010

(65) Prior Publication Data
US 2011/0062452 A1 Mar. 17, 2011

(30) Foreign Application Priority Data
Sep. 15, 2009 (JP) ................................ 2009-213292

(51) Int. Cl.
*H01L 21/00* (2006.01)
(52) U.S. Cl.
USPC .......................................................... 438/22
(58) Field of Classification Search ...................... 438/22
See application file for complete search history.

(56) References Cited

U.S. PATENT DOCUMENTS
2009/0286342 A1* 11/2009 Takahashi et al. .............. 438/32

FOREIGN PATENT DOCUMENTS
| JP | 2004-095649 A | 3/2004 |
| JP | 2009-043913 A | 2/2009 |
| JP | 2009-160025 A | 7/2009 |
| WO | WO 2007/015530 A1 | 2/2007 |

* cited by examiner

*Primary Examiner* — Jae Lee
(74) *Attorney, Agent, or Firm* — Holtz, Holtz, Goodman & Chick, P.C.

(57) ABSTRACT

The ohmic contact between a growth substrate and an electrode formed thereon is improved in a zinc oxide-based semiconductor light-emitting device, thereby improving the light-emission efficiency and reliability A step for forming an n-type semiconductor layer, a light-emitting layer, and a p-type semiconductor layer in sequence on a first principal face of a substrate having a composition of $Mg_xZn_{1-x}O$ ($0\leq x\leq 0.68$); a step for forming microcracks in a second principal face of the substrate so as to extend toward an interior of the substrate; a step for carrying out a heat treatment at a temperature of 100° C. or higher; and a step for forming an electrode by depositing a metal material composed of one among Al, a Ga alloy, and an In alloy on the second principal face of the substrate, and forming an electrode in a heat treatment at a temperature of 300° C. to 1000° C. are provided.

10 Claims, 6 Drawing Sheets

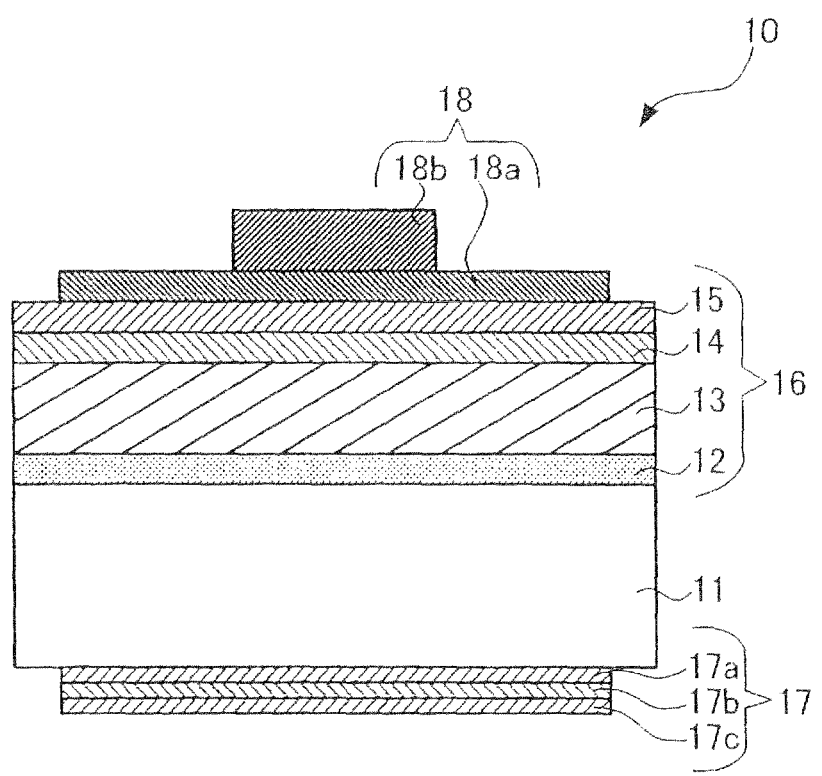

US 8,440,476 B2

METHOD FOR PRODUCING ZINC OXIDE-BASED SEMICONDUCTOR LIGHT-EMITTING DEVICE AND ZINC OXIDE-BASED SEMICONDUCTOR LIGHT-EMITTING DEVICE

BACKGROUND OF THE INVENTION

1. Field of the Invention

The present invention relates to a method for producing a zinc oxide-based semiconductor light-emitting device and a zinc oxide-based semiconductor light-emitting device; and particularly relates to a method for producing a zinc oxide-based semiconductor light-emitting device by layering a plurality of semiconductor layers on a substrate for growing zinc oxide-based material, and to a zinc oxide-based semiconductor light-emitting device produced by the above-noted production method.

2. Description of the Related Art

Zinc oxide (ZnO) is a direct band gap semiconductor having a band gap energy of 3.37 eV at room temperature and holds promise as a material for use in optical devices in the blue-ultraviolet region. In particular, zinc oxide possesses physical properties that are especially suitable for semiconductor light-emitting devices; i.e., an exciton binding energy of 60 meV and a refractive index (n) of 2.0. Furthermore, zinc oxide is inexpensive in terms of raw materials and has no adverse effects on the environment or the human body. Based on such physical properties and characteristics, there are high expectations that a high-efficiency, low-power consuming semiconductor light-emitting device can be achieved using zinc oxide-based materials.

Conventionally, a monometal is used as an electrode of a zinc oxide-based semiconductor light-emitting device. For example, aluminum (Al) is used as an electrode formed on a growth substrate (e.g., Japanese Patent Kokai No. 2004-95649 (Patent Literature 1) and WO 2007/015330 (Patent Literature 2). In Patent Literature 2, an n-type ZnO substrate as the growth substrate is ground and an electrode composed of Al is formed on the ground surface. However, there are problems in that oxide crystals and metal bond poorly together and sufficient ohmic contact cannot be obtained.

Alloys that include Ti are used in zinc oxide-based semiconductor light-emitting devices because of this bonding problem. For example, electrodes composed of Ti/Au, Ti/Al, or Ti/Al/Au alloy are known to be in use (e.g., Japanese Patent Kokai No. 2009-43913 (Patent Literature 3) and Japanese Patent Kokai No. 2009-160025 (Patent Literature 4). However, there are problems in that in electrodes composed of a Ti/Au alloy, Au absorbs emitted light; in electrodes composed of a Ti/Al alloy, the Al surface oxidizes and produces defective connections and defective joining; and in electrodes composed of a Ti/Al/Au alloy, an alloy layer having high electrical resistance is formed on the Al/Au interface. Furthermore, there is a problem in that the use of Ti leads to a reduction in reflectivity.

SUMMARY OF THE INVENTION

As described above, in the conventional methods for producing a zinc oxide-based semiconductor light-emitting device, single- and multiple-layer metal structures formed on a growth substrate all have insolvable problems in terms of ohmic contact, light-emission efficiency, and reliability.

The present invention has been contrived in view of the problems described above, it being an object of the invention to provide a production method for improving ohmic contact between the growth substrate or semiconductor layer and an electrode formed thereon in a zinc oxide-based semiconductor light-emitting device, and for improving the light-emission efficiency and reliability of a zinc oxide-based semiconductor light-emitting device; and to provide a zinc oxide-based semiconductor light-emitting device produced by this production method.

In order to solve the above-described problems, the method for producing a zinc oxide-based semiconductor light-emitting device comprises a step for forming an n-type semiconductor layer, a light-emitting layer, and a p-type semiconductor layer in sequence on a first principal face of a substrate having a composition of $Mg_xZn_{1-x}O$ ($0 \leq x \leq 0.68$); a step for forming microcracks in a second principal face of the substrate, the microcracks extending toward an interior of the substrate; a step for carrying out a heat treatment at a temperature of 100° C. or higher; and a step for depositing a metal material comprising one among Al, a Ga alloy, and an In alloy on the second principal face of the substrate, and performing a heat treatment at a temperature of 300° C. to 1000° C., thereby forming an electrode.

The method for producing a semiconductor light-emitting device of the present invention comprises a step for forming an n-type semiconductor layer, a light-emitting layer, and a p-type semiconductor layer having a composition of $Mg_xZn_{1-x}O$ ($0 \leq x \leq 0.68$) in sequence on the surface of a substrate having a composition of $Mg_xZn_{1-x}O$ ($0 \leq x \leq 0.68$); a step for removing the substrate and forming microcracks in on the surface the exposed n-type semiconductor layer, the microcracks extending toward an interior of the n-type semiconductor layer; a step for carrying out a heat treatment at a temperature of 100° C. or higher; and a step for depositing a metal material comprising one among Al, a Ga alloy, and an In alloy on the surface of the n-type semiconductor layer, and performing a heat treatment at a temperature of 300° C. to 1000° C., thereby forming an electrode.

Furthermore, in order to solve the problems described above, the semiconductor light-emitting device of the present invention comprises a substrate having a composition of $Mg_xZn_{1-x}O$ ($0 \leq x \leq 0.68$); a layered semiconductor layer having a structure in which an n-type semiconductor layer, a light-emitting layer, and a p-type semiconductor layer are layered in sequence, the layered semiconductor layer being formed on a first principal face of the substrate; an n-side electrode formed on a second principal face of the substrate; and a p-side electrode formed on the p-type semiconductor layer, wherein the n-side electrode has a first metal layer on which a metal layer made of any one among Al, a Ga alloy, and an In alloy is deposited without an interposed passive film on the second principal face of the substrate; the substrate has microcracks that extend from the second principal face toward the interior; and a portion of the metal material is diffused in the substrate.

Also, the semiconductor light-emitting device of the present invention comprises a layered semiconductor layer having a structure in which an n-type semiconductor layer, a light-emitting layer, and a p-type semiconductor layer having a composition of $Mg_xZn_{1-x}O$ ($0 \leq x \leq 0.68$) are layered in sequence; an n-side electrode formed on the n-type semiconductor layer; and a p-side electrode formed on the p-type semiconductor layer, wherein the n-side electrode has a first metal layer on which a metal material made of any one among Al, a Ga alloy, and an In alloy is deposited without an interposed passive film on the surface of the n-type semiconductor layer; the n-type semiconductor layer has microcracks that extend from the formation surface of the first metal layer toward the interior; and a portion of the metal material is diffused in the n-type semiconductor layer.

The method for producing a semiconductor light-emitting device of the present invention has an effect in that microcracks are formed in the growth substrate or the n-type semiconductor layer, and in the following electrode formation step a heat treatment is carried out at a temperature of 300° C. or higher after the metal material of the electrode has been formed, whereby the metal material of the electrode is caused to diffuse in the growth substrate or the n-type semiconductor layer. The method also provides an effect in that the formation of a passive film on the electrode is suppressed by formation surface carrying out a heat treatment at 100° C. or higher before the electrode is formed.

The semiconductor light-emitting device of the present invention is configured so that the growth substrate or the n-type semiconductor layer has microcracks that extend toward the interior, and an n-type electrode having a first metal layer on which any one among Al, a Ga alloy, and an In alloy is deposited is formed on the n-side electrode formation surface of the n-type semiconductor layer or the growth substrate without an interposing passive film. Therefore, the metal material of the first metal layer is diffused in the growth substrate or the n-type semiconductor layer.

As described above, the present invention provides a production method that can improve ohmic contact between the growth substrate or the semiconductor layer in a zinc oxide-based semiconductor light-emitting device and an electrode formed thereon, and improve the light-emission efficiency and reliability of an zinc oxide-based semiconductor light-emitting device; and also provides a zinc oxide-based semiconductor light-emitting device produced by the above-described production method.

BRIEF DESCRIPTION OF THE DRAWINGS

FIG. 1 is a cross-sectional view of the semiconductor light-emitting device of an embodiment of the present invention;

DESCRIPTION OF THE PREFERRED EMBODIMENTS

Figure 2A:
FIGS. 2A to 2D are a cross-sectional views in each of the production steps of the semiconductor light-emitting device of an embodiment of the present invention.

Embodiments of the present invention are described in detail below with reference to the accompanying drawings.

First, the structure of the semiconductor light-emitting device according to the present invention will be described in detail with reference to FIG. 1.

FIG. 1 is a cross-sectional view showing the semiconductor light-emitting device 10 according to the embodiments of the present invention. The semiconductor light-emitting device 10 has a layered semiconductor layer 16 in which a ZnO connection layer 12, an n-type MgZnO layer 13, an undoped light-emitting layer 14, and a p-type MgZnO layer 15 are layered in sequence on a first principal face (obverse surface) of an n-type zinc oxide (ZnO) substrate 11 as a growth substrate, as shown in FIG. 1. An n-side electrode layer 17 is formed on the second principal face (reverse surface) of the n-type ZnO substrate 11. A p-side electrode 18 is formed on the p-type MgZnO layer 15.

The n-side electrode layer 17 has a structure in which a first metal layer 17a composed of Al, a second metal layer 17b composed of Pt, and a third metal layer 17c composed of Au are layered in sequence on the reverse surface of the n-type ZnO substrate 11. The p-side electrode 18 is made up of a p-side transparent electrode 18a having a structure in which Ni and Au are layered on the p-type MgZnO layer 15, and a p-side connection electrode 18b having a structure in which Ti and Au are layered on the p-side transparent electrode 18a.

The length of one side of the semiconductor light-emitting device 10 is about 400 µm. The length of one side of the p-side transparent electrode 18a is about 280 µm.

The method for producing a semiconductor light-emitting device 10 having such a configuration is described in detail below with reference to FIGS. 2 to 4.

First, the n-type ZnO substrate 11 as a growth substrate is prepared (FIG. 2A). The n-type ZnO substrate 11 is doped with Al in a concentration of about 3.0 to $6.0 \times 10^{17}$ cm$^{-3}$. The substrate is doped with Al to facilitate diffusion of Al in the substrate into the n-type ZnO substrate 11 when the first metal layer 17a composed of Al is formed. This is due to the fact that Al in the n-type ZnO substrate 11 and Al in the first metal layer 17a will mutually diffuse. The thickness of the n-type ZnO substrate 11 is about 500 µm, and the first principal face (obverse surface) and the second principal face (reverse surface) are polished. In lieu of n-type ZnO substrate 11 doped with Al, a growth substrate doped with Ga or an undoped growth substrate may be used as the substrate.

Figure 2B:
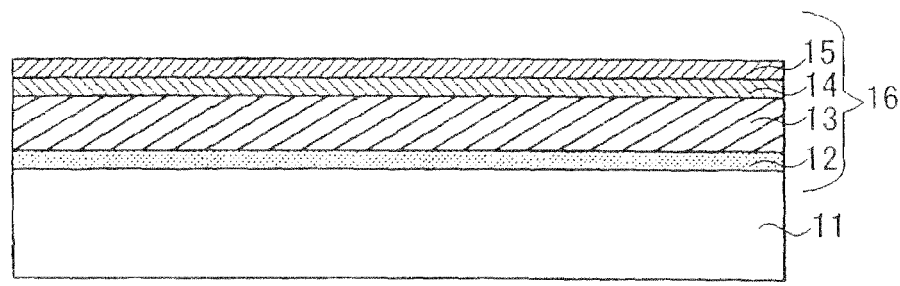

Next, a layered semiconductor layer 16 made up of the ZnO connection layer 12, the n-type MgZnO layer 13, the light-emitting layer 14, and the p-type MgZnO layer 15 is formed by metal organic chemical vapor deposition (MOCVD) on the first principal face of the n-type ZnO substrate 11 (FIG. 2B). The first principal face of the n-type ZnO substrate 11 is the Zn polar face (+c face). The production method is described in greater detail below.

First, the n-type ZnO substrate 11 is loaded into a MOCVD apparatus, and a heat treatment (thermal cleaning) is carried out for about 10 minutes at about 800 degrees centigrade (800° C.) in a water vapor atmosphere.

The substrate temperature is subsequently adjusted to be about 400° C., and the ZnO connection layer 12 having a thickness of about 20 nm is formed on the n-type ZnO substrate 11 by feeding dimethyl zinc (DMZn) and H$_2$O.

Next, the substrate temperature is increased to about 800° C. and heat-treated for about seven minutes in a water vapor atmosphere to restore the crystallinity of the ZnO connection layer 12.

The substrate temperature is then adjusted to about 800° C., and an n-type Mg$_x$Zn$_{1-x}$O (x=0.20) layer 13 having a thickness of about 500 nm is formed on the ZnO connection layer 12 by feeding DMZn, biscyclopentadienyl magnesium (Cp$_2$Mg), H$_2$O, and triethyl gallium (TEGa). In this case, the TEGa feed rate is adjusted so that the concentration of Ga, which is an n-type impurity, is $5 \times 10^{17}$ to $1 \times 10^{19}$ cm$^{-3}$.

Next, the substrate temperature is kept at about 800° C., and the light-emitting layer 14 composed of an undoped ZnO layer having a thickness of about 30 nm is formed on the n-type MgZnO layer 13 by feeding DMZn and $H_2O$.

The substrate temperature is then kept at about 800° C., and a p-type $Mg_xZn_{1-x}O$ (x=0.25) layer 15 having a thickness of about 100 nm is formed on the light-emitting layer 14 by feeding DMZn, $Cp_2Mg$, $H_2O$, and ammonia ($NH_3$). The feed rate of $NH_3$ is adjusted so that the concentration of N as the n-type impurity is $5 \times 10^{17}$ to $2 \times 10^{20}$ cm$^{-3}$.

The crystal growth method is not limited to MODVD, it being also possible to use, e.g., molecular beam epitaxy (MBE). Also, other than Ga, it is possible to use Al or In as the n-type dopant, and As or P may be used instead of N as the P-type dopant.

Figure 2C:
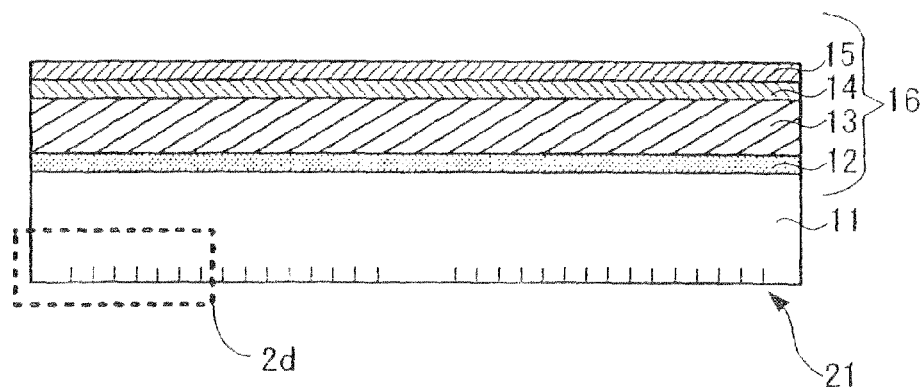

Next, microcracks 21 that extend toward the interior are formed in the second principal face by polishing the second principal face (i.e., the n-side electrode layer 17 formation surface) of the n-type ZnO substrate 11 (FIG. 2C). Specifically, the second principal face of the n-type ZnO substrate 11 is polished using a lapping sheet. It is preferred that the polishing grains of the lapping sheet be small, e.g., about 0.3 µm. In this case, the depth of the microcracks 21 is set to 1 µm to 3 µm. The reason for this setting is as follows. When the depth of the microcracks 21 is less than 1 µm, the microcracks end up disappearing in the step for removing the polishing material in a later-described etching step and the metal cannot diffuse when the first metal layer 17a is formed. When the depth is greater than 3 µm (grain diameter of the polishing material: 1 µm), more time is required for etching. The grain diameter of the polishing material grains is preferably small because it is more effective to increase the density rather than the depth of the microcracks in order to increase the surface concentration of Al when the Al is diffused.

Figure 2D:
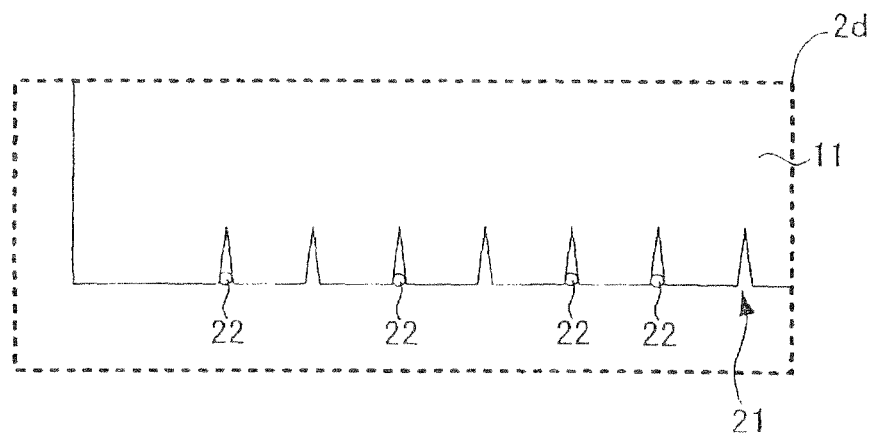

After polishing, polishing material 22 remains inside the microcracks 21 (i.e., embedded in the ZnO crystal), as shown in FIG. 2D, which is an enlarged view of the broken line region 2d of FIG. 2C. This is because the Mohs hardness of the ZnO crystal is 4 to 5, and the n-type ZnO substrate 11 is relatively soft. When polishing material 22 remains, a passive layer is formed as an oxide layer produced by the polishing material 22, and good ohmic contact cannot be obtained between the n-type ZnO substrate and the n-side electrode layer 17. Therefore, it is important to carry out the following treatment after the polishing step, which is the present step.

Figure 3A:
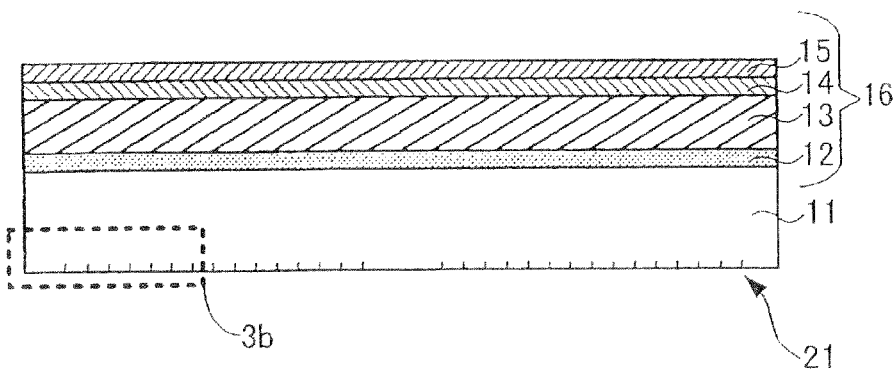
FIGS. 3A to 3D are a cross-sectional views in each of the production steps of the semiconductor light-emitting device of an embodiment of the present invention.
Figure 3B:
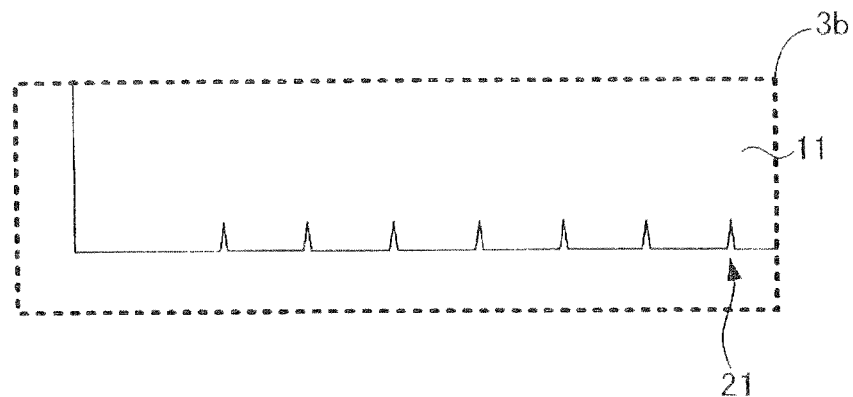

After the above-described polishing, the surface of the n-type ZnO substrate 11 in which the microcracks 21 are formed is etched, and the polishing material 22 is removed (FIGS. 3A and 3B). Specifically, the surface of the n-type ZnO substrate 11 in which the microcracks 21 are formed is immersed in nitric acid and wet-etched for about three minutes. The etching distance (allowance) is 0.7 µm to 2.0 µm, which is about ⅔ of the depth of the microcracks. FIG. 3B is an enlarged view of the broken line region 3b of FIG. 3A.

In this case, the surface of the n-type ZnO substrate 11 in which the microcracks 21 are formed is an O-polarity surface (−c face) and is therefore readily etched with acid. On the other hand, the surface on which the layered semiconductor layer 16 is formed is a Zn polarity surface (+c face) and is therefore difficult to etch with acid. Accordingly, etching can be readily carried out without protecting the surface on which the layered semiconductor layer 16 has been formed.

As described above, etching can improve the efficiency of removing the polishing material 22, which is an oxidizable material, and a passive layer is no longer formed as a oxide film on the second principal face of the n-type ZnO substrate 11. Also, metal material can be diffused with good efficiency in the later-described formation of the first metal layer 17a because microcracks 21 are present in the second principal face of the n-type ZnO substrate 11 after etching.

Next, the n-type ZnO substrate 11 on which the layered semiconductor layer 16 and the microcracks 21 are formed is heat-treated for five minutes at about 300° C. in a nitrogen atmosphere. Moisture (crystal water), oxygen, and oxygen-containing substances (NOx) adsorbed to the ZnO crystal face can be removed (desorbed) by this heat treatment. The present step is referred to as the desorption treatment step.

In the desorption treatment step described above, the heating temperature can be suitably adjusted within a range of 100° C. to 1000° C. The reason that such an adjustment is possible is that substances adsorbed on the ZnO crystal face cannot be removed when the temperature is less than 100° C., and impurities of each layer constituting the layered semiconductor layer 16 mutually diffuse when the temperature is above 1000° C. and the light-emission efficiency of the semiconductor light-emitting device is reduced. It is particularly practical in terms of removing crystal moisture to set the heating temperature to 200° C. to 400° C. and carry out the heat treatment for about 3 to 30 minutes.

In the desorption treatment step described above, the heat treatment must be carried out in the presence of a high-purity nitrogen gas flow. This is due to the fact that adsorbed substances thus desorbed are removed (i.e., adsorbed substances are taken away in the flow to the gas discharge port) from the vicinity of the n-type ZnO substrate 11. For example, the nitrogen purity is 1 ppm or less in terms of the impurity (e.g., oxygen) residue, and the gas flow rate over the n-type ZnO substrate 11 is 1 cm/sec or more. A nitrogen gas purity of 1 ppm or less in terms of the impurity residue is effective, but is preferably 10 ppb or less, and even more preferably 1 ppb or less.

Next, the n-type ZnO substrate 11 thus having been subjected to desorption treatment is mounted on a vapor deposition jig (auxiliary cell) provided with a metal mask having openings that correspond to the shape of the n-side electrode layer 17. The reason for using a metal mask as the vapor deposition mask is that hydrocarbons containing oxygen remain on the ZnO crystal face during development when a resist mask is used. The vapor deposition jig on which the n-type ZnO substrate 11 is mounted is subsequently mounted on an electron beam vapor deposition apparatus. The electron beam deposition apparatus is then evacuated to form a vacuum. At this point, in the process for evacuating and forming a vacuum, the vacuum state is preferably maintained for about one hour after the degree of vacuum in the apparatus has reached a predetermined level at which vacuum deposition can be carried out. This is because of a possibility that moisture and oxygen or another oxidizing gas are deposited on the ZnO crystal face immediately after the degree of vacuum inside the apparatus has reached a predetermined level at which vacuum deposition can be carried out. One hour after the degree of vacuum inside the apparatus has reached a level at which vacuum deposition can be carried out, Al, Pt, Au are layered in sequence by electron beam vapor deposition on the second principal face of the n-type ZnO substrate 11 (i.e., the surface on which the microcracks 21 are formed). In this case, the thickness of Al is 60 nm, the thickness of the Pt is 200 nm, and the thickness of the Au is 700 nm.

These thicknesses can be suitably set in a range of 10 nm to 300 nm for Al, 30 nm to 300 nm for Pt, and 500 nm to 1000 nm for Au. Other than electron beam vapor deposition, these metal materials may be deposited by sputtering, plasma CVD, and PLD.

After the desorption process, when the steps up to and including electron beam vapor deposition are more effectively carried out in a glove box having a de-vaporized, deoxygenated atmosphere, and it is possible to prevent re-deposition of moisture, oxygen, and the like on the ZnO crystal face. More preferably, the inlet and outlet of the apparatus are connected to the glove box.

Figure 3C:
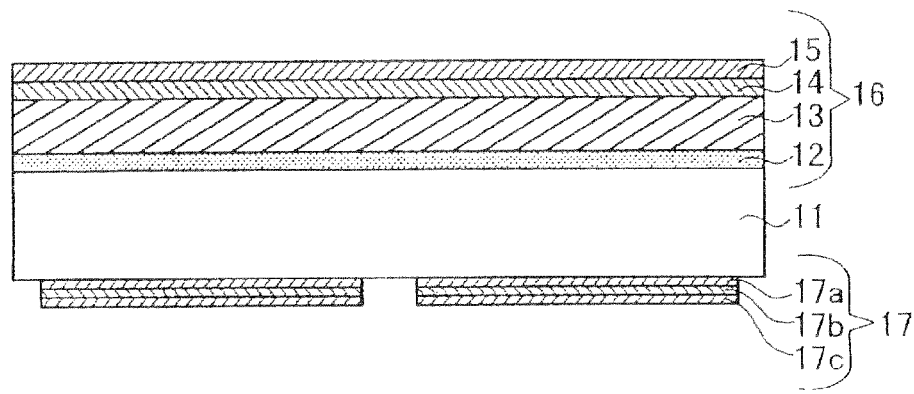

Next, the n-type ZnO substrate 11 in which Al, Pt, and Au have been layered in sequence is mounted on a rapid thermal annealer (RTA) and is heat-treated for five minutes at about 500° C. in a nitrogen atmosphere. This heat treatment completes the formation of the first metal layer 17a composed of Al, the second metal layer 17b composed of Pt, and the third metal layer 17c composed of Au; and completes the formation of the n-side electrode layer 17 composed of the first to third metal layers (FIG. 3C).

In the present step, since the microcracks 21 are formed and the desorption process is carried out prior to vapor-deposition performed using electron beam vapor deposition, the Al of the first metal layer 17a is readily diffused in the n-type ZnO substrate 11. Accordingly, it is possible to obtain good ohmic contact between the n-type ZnO substrate 11 and the n-side electrode layer 17, even when the heat treatment temperature is about 500° C. In the present embodiment, the temperature during formation of the n-side electrode layer 17 is 500° C., but good ohmic contact can be obtained by forming the microcracks 21 and carrying out desorption when the heat treatment is carried out at 300° C. or higher.

In the case that the bonding characteristics between the n-type ZnO substrate 11 and the n-side electrode layer 17 must be further improved, the temperature in the heat treatment can be set within a range of 500° C. to 600° C. When the heat treatment is carried out at a temperature within the above-stated range, it is possible to reduce peeling defects between the n-type ZnO substrate 11 and the n-side electrode layer 17 after a heat treatment step at 300° C. such as Au/Sn eutectic bonding.

Furthermore, in the case that the Al of the first metal layer 17a is to be diffused at high concentration in the ZnO crystal, the temperature in the heat treatment may be set in a range of 600° C. to 700° C. When the heat treatment is carried out at a temperature within this range, the Al in the ZnO crystal is diffused at $1 \times 10^{18}$ to $10^{19}$ cm$^{-3}$. In other words, the Fermi level reaches the conduction band and a state of degeneration is assumed, and the second principal face of the n-type ZnO substrate 11 enters a state resembling a metallic state. Accordingly, the contact resistance between the n-type ZnO substrate 11 and the n-side electrode layer 17 is reduced and good ohmic contact can be obtained.

In the case that Al is to be solid-dissolved in the ZnO crystal, the temperature of the heat treatment may be set within 700° C. to 1000° C. In this case, the term "solid solution" refers to Al diffused in the ZnO crystal at a concentration of 4 to $8 \times 10^{20}$ cm$^{-3}$ and the formation of a solid-solution layer in which Al is present in a solid-solution state in the second principal face (i.e., the boundary with the first metal layer 17a) of the n-type ZnO substrate 11. When a solid-solution layer is formed, a contiguous state is formed in which the boundary between the ZnO crystal and the Al has disappeared. Therefore, the reflectivity on the Al face can be stabilized (change over time is suppressed). Accordingly, the light-emission efficiency of the semiconductor light-emitting device is stabilized, i.e., reliability can be improved.

Next, a resist is coated on the p-type MgZnO layer 15. A desired pattern is formed on the resist by photolithography. The patterned resist is used as a mask and Ni and Au are layered in sequence using a known film formation technique such as electron beam vapor deposition. In this case, the thickness of the Ni is 1.5 nm and the thickness of the Au is 10 nm. The resist is then removed. The n-type ZnO substrate 11 in a state in which Ni/Au is layered on the p-type MgZnO layer 15 is mounted on the RTA and the heat treatment is carried out for 30 seconds at about 500° C. in a nitrogen atmosphere containing oxygen (1 to 20 vol %). This heat treatment can provide transparency to the metal composed of Ni/Au, and completes the formation of the p-side transparent electrode 18a.

Figure 3D:
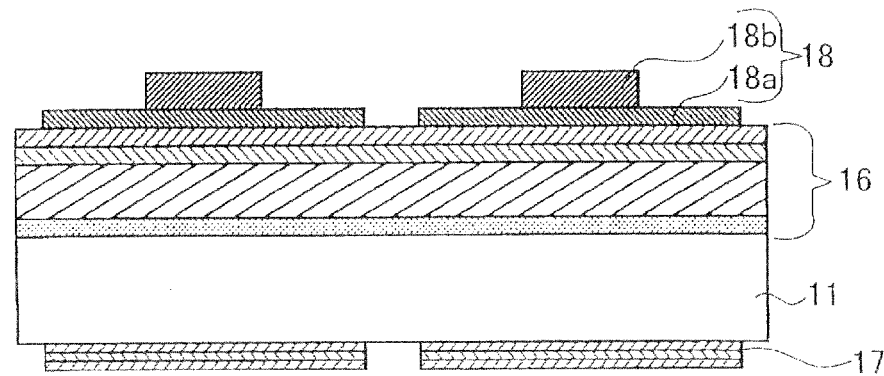

Next, a resist is coated onto the p-type MgZnO layer and the p-side transparent electrode 18a. A desired pattern is formed on the resist by photolithography. The patterned resist is used as a mask and Ti and Au are layered in sequence using a known film formation technique such as electron beam vapor deposition. In this case, the thickness of the Ti is 10 nm and the thickness of the Au is 500 to 1000 nm. The resist is then removed to complete the formation of the p-side connection electrode 18b and to complete the formation of the p-side electrode 18 composed of the p-side transparent electrode 18a and the p-side electrode 18b (FIG. 3D).

Figure 4A:
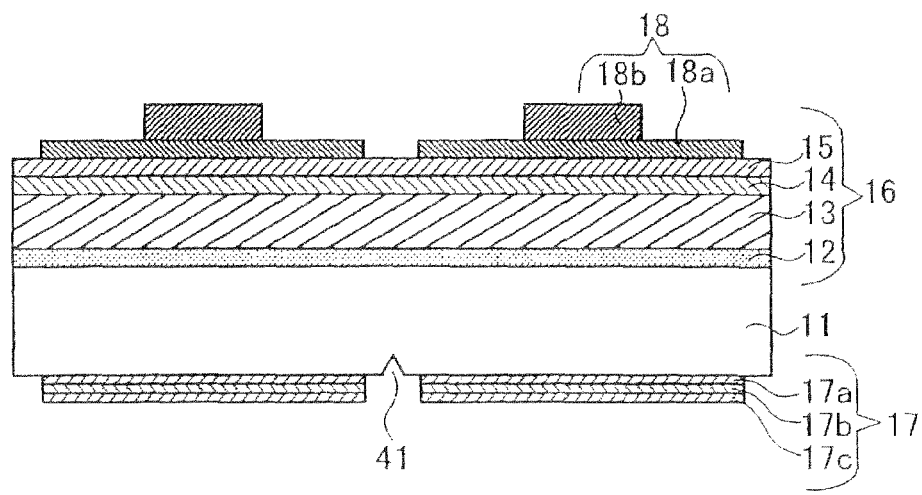
FIG. 4A to 4C are cross-sectional views in each of the production steps of the semiconductor light-emitting device of an embodiment of the present invention.
Figure 4B:
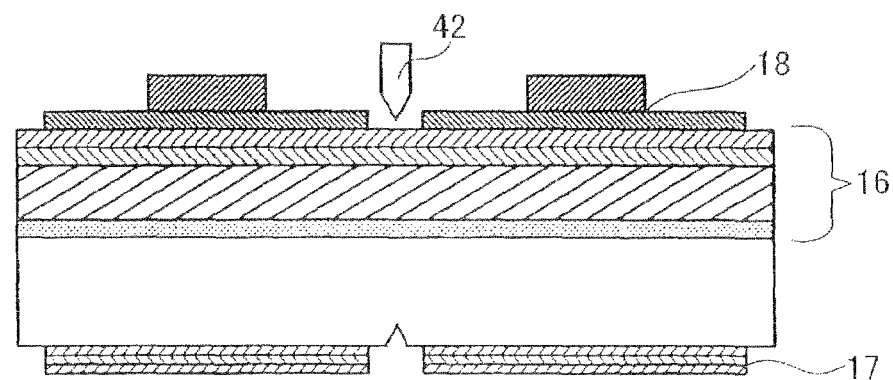
Figure 4C:
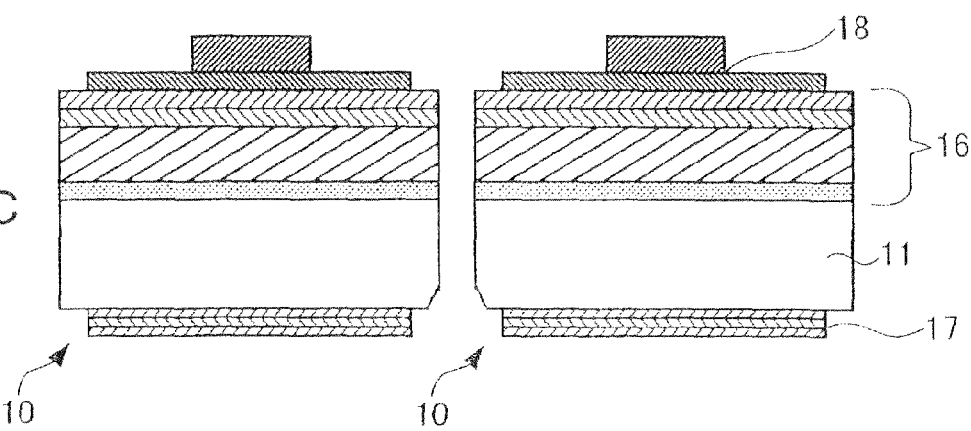

Next, a gap (i.e., the portion in which the n-side electrode layer 17 is not formed) is scribed between n-side electrodes, which is the partitioning groove of the semiconductor light-emitting device, and a grid-shaped scribe groove 41 is formed (FIG. 4A). A knife edge 42 is pressed into the gap between the p-side electrodes on the obverse side of the p-type MgZnO layer 15 and pressure is applied to thereby perform breakage (FIG. 4B). The devices are thereby separated and the formation of the semiconductor light-emitting device 10 is completed (FIG. 4C).

In the production method described above, Al is used as the first metal layer 17a, but a Ga alloy (e.g., an Al/Ga alloy), an In alloy (e.g., an Al/In alloy), or another metal may be used. These metals are materials that may constitute n-type impurities in the in the ZnO crystal and are therefore suitable as the first layer of the n-side electrode. Also, Pt is used as the second metal layer 17b, but it is also possible to use Rh, Pd, Ir, or an alloy of these, or another metal material (protective metal). This is due to the fact that the second metal layer 17b preferably prevents mutual diffusion between the first metal layer 17a and the third metal layer 17c. For example, Rh is highly reflective through the ultraviolet region, and when used as the second metal layer 17b, Rh therefore has the effect of reducing reflectivity in the case that the first metal layer 17a is made thin. The second metal layer 17b also functions as a protective layer for preventing oxidation of the first metal layer 17a.

In the embodiment described above, a layered semiconductor layer was formed in which an n-type semiconductor layer having a composition of $Mg_xZn_{1-x}O$ (x=0.20), a light-emitting layer having a composition of $Mg_xZn_{1-x}O$ (x=0), and a p-type semiconductor layer having a composition of $Mg_xZn_{1-x}O$ (x=0.25) have been layered in sequence. However, the growth substrate and the layered semiconductor layer can be formed using a $Mg_xZn_{1-x}O$ (0≦x≦0.68) composition. In other words, layered in sequence on the $Mg_xZn_{1-x}O$ (0≦x≦0.68) substrate are an MgZnO connection layer having a composition of $Mg_xZn_{1-x}O$ (0≦x≦0.68), an n-type MgZnO layer doped with Ga and having a composition of $Mg_xZn_{1-x}O$ (0≦x≦0.68), a light-emitting layer having a composition of $Mg_xZn_{1-x}O/Mg_yZn_{1-y}O$ (0≦x, y≦0.68: y<x), and a p-type MgZnO layer doped with N and having a composition of $Mg_xZn_{1-x}O$ (0≦x≦0.68).

In other words, in the embodiment described above, Mg can be included in the growth substrate and the layered semiconductor layer if desired. In such a case, the light-emission efficiency can be made better than when Mg is not included.

The production method and other structures are the same as the embodiment described above.

Figure 5:
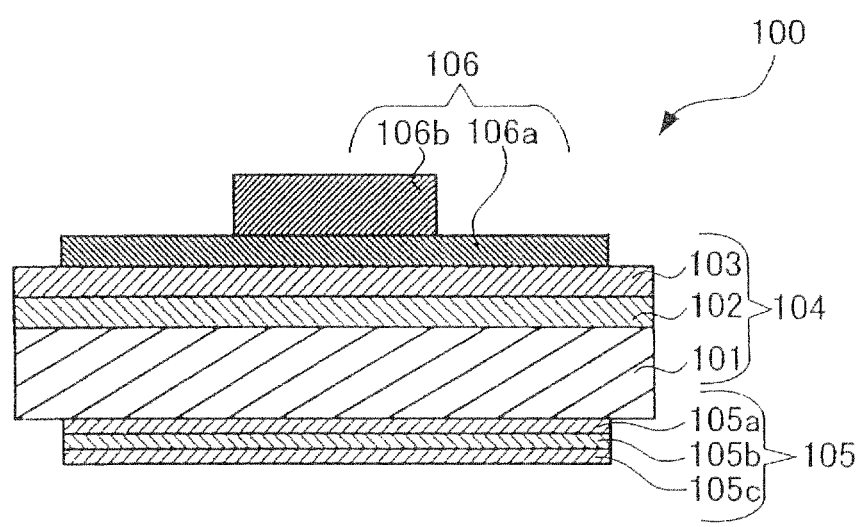
FIG. 5 is a cross-sectional view of another structure of the semiconductor light-emitting device of the present invention.

In the embodiment described above, the n-side electrode layer 17 is formed on the growth substrate (n-type ZnO substrate 11), but may be formed directly on the n-type semiconductor. For example, as shown in FIG. 5, the semiconductor light-emitting device 100 is composed of a layered semiconductor layer 104 that includes an n-type semiconductor layer 101, a light-emitting layer 102, and a p-type semiconductor layer 103 having a composition of $Mg_xZn_{1-x}O$ ($0 \leq x \leq 0.68$); an n-side electrode 105 formed on the n-type semiconductor layer 101, and a p-side electrode 106 formed on the p-type semiconductor layer 103.

The n-side electrode 105 has a structure in which a first metal layer 105a composed of Al, a second metal layer 105b composed of Pt, and a third metal layer 105c composed of Au are layered in sequence. The p-side electrode 106 is made up of a p-side transparent electrode 106a having a structure in which Ni and Au are layered, and a p-side connection electrode 106b having a structure in which Ti and Au are layered on the p-side transparent electrode 106a.

Specifically, the semiconductor light-emitting device 100 has a structure that does not include the n-type ZnO substrate 11 and the ZnO connection layer 12 of the semiconductor light-emitting device 10 in the embodiment described above, but the structure is otherwise the same.

In the method for producing a semiconductor light-emitting device 100, first, a layered semiconductor layer 104 that includes the n-type semiconductor layer 101, the p-type semiconductor layer 103, and the layered semiconductor layer 104 is formed on a growth substrate; and the growth substrate is polished away until about 10 to 50 μm of the growth substrate remains and is then etched with an etching solution composed of nitric acid or the like until the n-type semiconductor layer 101 is exposed. Next, microcracks that extend toward the interior of the n-type semiconductor layer 101 are formed in the surface of the exposed n-type semiconductor layer 101. Thereafter, etching is performed, desorption by heating to 100° C. or higher is performed, the n-side electrode 105 is formed on the n-type semiconductor layer 101, and heat treatment can be further carried out. The p-side electrode 106 is furthermore formed on the p-type semiconductor layer 103. Specifically, the method for producing the semiconductor light-emitting device 100 is the same as the method for producing the semiconductor light-emitting device 10 described above, except that a step for removing the growth substrate has been added, and the portion in which the microcracks and the n-side electrode 105 are formed on the surface of the n-type semiconductor layer 101 exposed by the removal step is different.

In the case that the growth substrate is removed and the n-side electrode 105 is formed on the n-type semiconductor layer 101, the thickness of the n-type semiconductor layer 101 is preferably about 10 to 100 μm, e.g., 30 μm, with the formation of microcracks taken into account.

A carrier can be joined to the p-type semiconductor layer prior to removing the growth substrate. For example, the carrier may be joined using a method for heating and crimping a separately prepared support substrate via a metal layer, a method for directly laminating a support substrate composed of a p-type compound semiconductor crystal to the p-type semiconductor layer, or another method.

In the embodiment described above and in the other embodiment for removing the substrate, the growth substrate or the layered semiconductor layer formed on the growth substrate can be formed by growing $Mg_xZn_{1-x}O$ ($0 \leq x \leq 0.40$) by liquid-phase deposition, or by growing $Mg_xZn_{1-x}O$ ($0 \leq x \leq 0.68$) by MOVCD or MBE.

In the case that the heat treatment is carried out at 500° C. or higher, it is possible that the heat balance state will not be maintained, phase separation may occur, and the device properties may be degraded when the Mg composition is greater than 0.40 in the MgZnO layer.

Accordingly, in the case that the temperature is 500° C. or higher in the heat treatment prior to electrode formation or the heat treatment after the electrode material has been deposited, the composition of the growth substrate and the layered semiconductor layer is preferably $Mg_xZn_{1-x}O$ ($0 \leq x \leq 0.40$).

Next, a comparison will be made with reference to FIG. 6A in relation to the characteristics of the semiconductor light-emitting device produced by the production method of the present embodiment, the semiconductor light-emitting device produced using the method for production of a modified example (an example in which Mg has been added to the growth substrate) of the present embodiment, and the semiconductor light-emitting device produced using a conventional production method. The configuration of the modified example is the same as the configuration of the embodiment described above, except that the growth substrate is $Mg_xZn_{1-x}O$ ($0 \leq x \leq 0.68$).

Here, the semiconductor light-emitting device produced by a conventional production method has a different n-side electrode structure from the semiconductor light-emitting device 10 of the present embodiment. Specifically, the n-side electrode has a structure in which Ti and Au are layered. In the production method, the formation of microcracks and the desorption treatment of the present embodiment were not carried out.

Figure 6A:
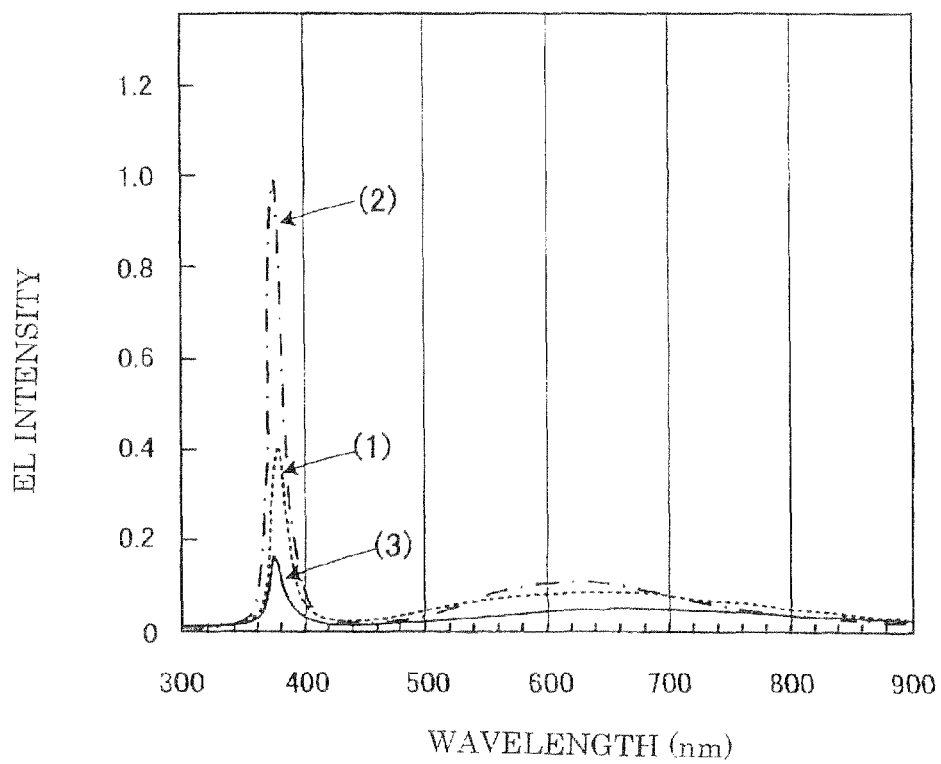
FIG. 6A is an EL spectrum of the semiconductor light-emitting device of an embodiment of the present invention and a conventional semiconductor light-emitting device.

FIG. 6A is an EL spectrum (when the electric current flowing to the device is 40 mA) of the semiconductor light-emitting device of the present embodiment (graph (1) indicated by the dotted line), the semiconductor light-emitting device of the modified example (graph (2) indicated by the dotted-and-dashed line), and a conventional semiconductor light-emitting device (graph (3) indicated by the solid line). The horizontal axis the wavelength (nm) and the vertical axis is the EL intensity. The values on the vertical axis are normalized using the peak value of the semiconductor light-emitting device of the modified example as a "1.0" (reference value).

It is apparent form FIG. 6A that all of the semiconductor light-emitting devices have a peak in the vicinity of about 380 nm. The semiconductor light-emitting device of the present embodiment has an EL intensity that is about 2.5 times greater than that of a conventional semiconductor light-emitting device. This is thought to be due to light emitted from the light-emission layer no longer being absorbed by the Au and being reflected with good efficiency by the Al. The semiconductor light-emitting device of the modified example has an EL intensity that is about 5 times greater than that of a conventional semiconductor light-emitting device. This is thought to be due to the fact that Mg has been added to the growth substrate, whereby light emitted from the light-emission layer is no longer absorbed by the ZnO substrate and is reflected with good efficiency by the Al.

Next, a comparison will be made with reference to FIG. 6B in relation to the semiconductor light-emitting device produced by the production method of the present embodiment and the semiconductor light-emitting device produced without desorption treatment and the formation of microcracks (hereinbelow referred to as "comparative example"). The comparative example is produced using the same steps as the embodiment, except that the desorption treatment and the formation of microcracks are not carried out, and the heat treatment is also carried out for 5 minutes at 500° C.

Figure 6B:
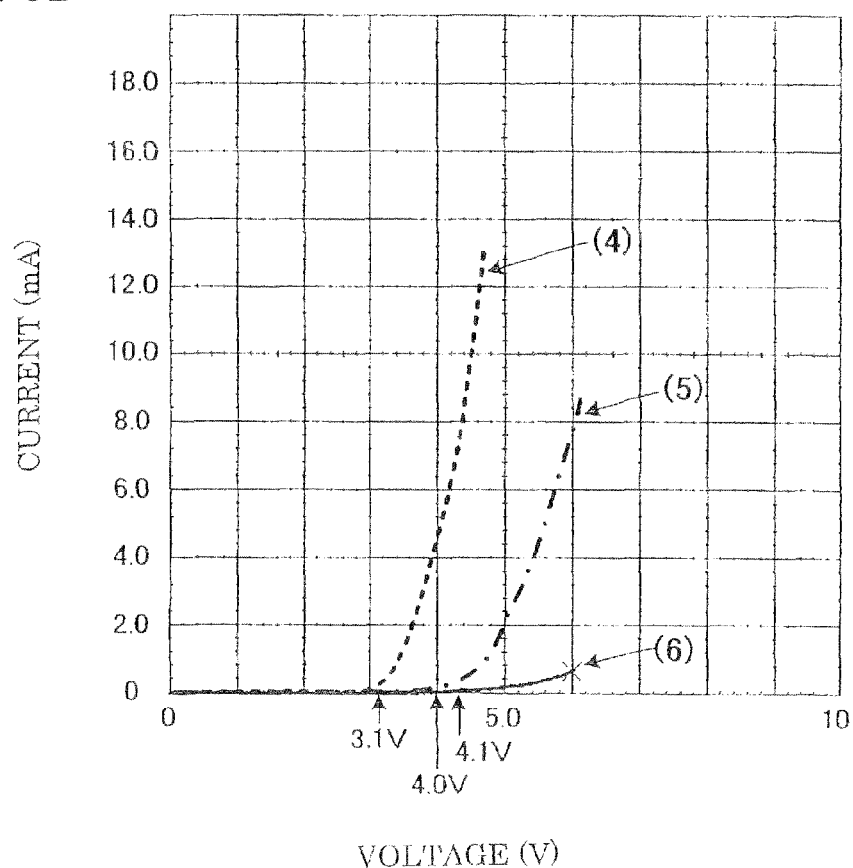
FIG. 6B shows the I-V characteristics of the semiconductor light-emitting device of an embodiment of the present invention and a conventional semiconductor light-emitting device.

FIG. 6B shows the I-V characteristics following an accelerated test (85° C., 85%, 500 hours) of the semiconductor light-emitting device of the present embodiment (graph (4) indicated by the dotted line) and the semiconductor light-emitting device of the comparative example (graph (5) indicated by the dotted-and-dashed line, and graph (6) indicated by the solid line). The horizontal axis is the voltage (V) and the vertical axis is the electric current (mA).

The graphs (5) and (6) in FIG. 6B show the diode characteristics after the accelerated test of the semiconductor light-emitting device of the comparative example. The semiconductor light-emitting device of the comparative example exhibited unstable diode characteristics after the accelerated test.

Specifically, the characteristics after the accelerated test of the semiconductor light-emitting device in graph (5) of the comparative example show that the threshold voltage (the voltage measured when the electric current is 0.4 mA in the present measurement) was 4.0 V. The characteristics after the accelerated test of the semiconductor light-emitting device in graph (6) of the comparative example show that the voltage is 4.1 V when the electric current value is 0.4 mA, and such I-V characteristics are very poor in that electric current does not flow even when the voltage is on the higher voltage side.

On the other hand, the semiconductor light-emitting device of the present embodiment exhibited better diode characteristics than the semiconductor light-emitting device of the comparative example. Specifically, the characteristics (graph (4)) of the semiconductor light-emitting device of the present embodiment after the accelerated test show that the rising voltage is 3.1 V when the electric current value is 0.4 mA and that good ohmic contact is obtained.

The reasons that the characteristics of the semiconductor light-emitting device of the comparative example are not good are thought to be that a passive film is formed at the boundary between the growth substrate and the n-side electrode because a desorption treatment is not performed, and the semiconductor light-emitting device has high resistance because the diffusion of Al into the n-type ZnO substrate is insufficient. It is also thought that the diffusion of Al into the n-type ZnO substrate is insufficient because microcracks have not been formed. It is furthermore thought that the bonding characteristics of the n-side electrode to the substrate are poor and the diode characteristics are unstable because a passive film has been formed and microcracks are not present.

On the other hand, the semiconductor light-emitting device 10 avoids the formation of a passive film when a desorption treatment is carried out prior to vapor-deposition of the material of the n-side electrode layer 17. Also, Al can be sufficiently diffused into the n-type ZnO substrate 11 because microcracks 21 are formed in the second principal face of the n-type ZnO substrate 11, and heat treatment is carried out at 300° C. to 1000° C. after Al has been formed. In other words, the semiconductor light-emitting device 10 of the present embodiment can obtain good ohmic contact and also has good I-V characteristics because a passive film is not formed and sufficient Al diffusion is achieved.

In the structure of the n-side electrode layer 17 of the present embodiment, Al oxidation is suppressed by the Pt and Au that cover the Al.

As described above, the method for producing the semiconductor light-emitting device of the present invention is characterized in having a step for forming in sequence an n-type semiconductor layer, a light-emitting layer, and a p-type semiconductor layer on a first principal face of a substrate having a composition of $Mg_xZn_{1-x}O$ ($0 \leq x \leq 0.68$); a step for forming microcracks in a second principal face of the substrate so as to extend toward an interior of the substrate; a step for carrying out a heat treatment at a temperature of 100° C. or higher; and a step for forming an electrode by depositing a metal material composed of one among Al, a Ga alloy, and an In alloy on the second principal face of the substrate, and performing a heat treatment at a temperature of 300° C. to 1000° C., to form an electrode.

Another production method is characterized in having a step for forming in sequence an n-type semiconductor layer, a light-emitting layer, and a p-type semiconductor layer having a composition of $Mg_xZn_{1-x}O$ ($0 \leq x \leq 0.68$) on the surface of substrate having a composition of $Mg_xZn_{1-x}O$ ($0 \leq x \leq 0.68$); a step for removing the substrate and forming microcracks in on the surface the exposed n-type semiconductor layer so as to extend toward an interior of the n-type semiconductor layer; a step for carrying out a heat treatment at a temperature of 100° C. or higher; and a step for forming an electrode by depositing a metal material composed of one among Al, a Ga alloy, and an In alloy on the surface of the n-type semiconductor layer, and performing a heat treatment at a temperature of 300° C. to 1000° C., to form an electrode.

In other words, the method for producing the semiconductor light-emitting device of the present invention has an effect in that microcracks are formed in the growth substrate or the n-type semiconductor layer, and in the following electrode formation step a heat treatment is carried out at a temperature of 300° C. or higher after the metal material of the electrode has been formed, whereby the metal material of the electrode is diffused in the ZnO crystal (the growth substrate or the n-type semiconductor layer) and good ohmic contact is obtained. The method has another effect in that carrying out a heat treatment at 100° C. or higher before the electrode is formed suppresses the formation of a passive film on the electrode formation surface.

The semiconductor light-emitting device of the present invention is characterized in having a substrate having a composition of $Mg_xZn_{1-x}O$ ($0 \leq x \leq 0.68$); a layered semiconductor layer having a structure in which an n-type semiconductor layer, a light-emitting layer, and a p-type semiconductor layer are layered in sequence, the layered semiconductor layer being formed on a first principal face of the substrate; an n-side electrode formed on a second principal face of the substrate; and a p-side electrode formed on the p-type semiconductor layer, wherein the growth substrate has microcracks that extend from the second principal face toward the interior; and the n-side electrode has a first metal layer on which a metal material made of any one among Al, a Ga alloy, and an In alloy is deposited without an interposed passive film on the second principal face of the substrate.

Another semiconductor light-emitting device is characterized in having a layered semiconductor layer having a structure in which an n-type semiconductor layer, a light-emitting layer, and a p-type semiconductor layer having a composition of $Mg_xZn_{1-x}O$ ($0 \leq x \leq 0.68$) are layered in sequence; an n-side electrode formed on the n-type semiconductor layer; and a p-side electrode formed on the p-type semiconductor layer, wherein the n-side electrode has a first metal layer on which a metal material made of any one among Al, a Ga alloy, and an In alloy is deposited without an interposed passive film on the surface of the n-type semiconductor layer; the n-type semiconductor layer has microcracks that extend from the formation surface of the first metal layer toward the interior; and a portion of the metal material is diffused in the n-type semiconductor layer.

In other words, the metal material of the first metal layer diffuses into the growth substrate because the semiconductor light-emitting device of the present invention has microcracks that extend toward the interior of the growth substrate and the n-type semiconductor layer, and an n-type electrode having a first metal layer on which one among Al, a Ga alloy, and an In alloy is deposited without an interposing passive film on the n-electrode formation surface of the n-type semiconductor layer or the growth substrate.

As described above, the present invention provides a production method for improving ohmic contact between the growth substrate or semiconductor layer and an electrode formed thereon in a zinc oxide-based semiconductor light-emitting device, and for improving the light-emission efficiency and reliability of a zinc oxide-based semiconductor light-emitting device; and provides a zinc oxide-based semiconductor light-emitting device produced by this production method.

This application is based on Japanese Patent Application No. 2009-213292 which is herein incorporated by reference.

What is claimed is:

1. A method for producing a semiconductor light-emitting device, comprising:
   a step for forming an n-type semiconductor layer, a light-emitting layer, and a p-type semiconductor layer in sequence on a first principal face of a substrate having a composition of $Mg_xZn_{1-x}O$ ($0 \leqq x \leqq 0.68$);
   a step for forming microcracks in a second principal face of said substrate, said microcracks extending toward an interior of said substrate;
   a step for carrying out a heat treatment at a temperature of 100° C. or higher; and
   a step for depositing a metal material comprising one among Al, a Ga alloy, and an In alloy on said second principal face of said substrate; and performing a heat treatment at a temperature of 300° C. to 1000° C., thereby forming an electrode.

2. The production method of claim 1, wherein the step for forming said microcracks includes a polishing treatment using a polishing material, and an etching process for removing said polishing material remaining on the second principal face of said substrate.

3. A method for producing a semiconductor light-emitting device, comprising:
   a step for forming in sequence an n-type semiconductor layer, a light-emitting layer, and a p-type semiconductor layer having a composition of $Mg_xZn_{1-x}O$ ($0 \leqq x \leqq 0.68$) on the surface of a substrate having a composition of $Mg_xZn_{1-x}O$ ($0 \leqq x \leqq 0.68$);
   a step for removing said substrate and forming microcracks on the surface of said exposed n-type semiconductor layer, said microcracks extending toward an interior of said n-type semiconductor layer;
   a step for carrying out a heat treatment at a temperature of 100° C. or higher; and
   a step for depositing a metal material comprising one among Al, a Ga alloy, and an In alloy on the surface of said n-type semiconductor layer; and performing a heat treatment at a temperature of 300° C. to 1000° C., thereby forming an electrode.

4. The production method of claim 3, wherein said microcracks formation step includes a polishing treatment using a polishing material, and an etching process for removing said polishing material remaining on the surface of said n-type semiconductor layer.

5. The production method of claim 1, wherein the heat treatment is carried out at a temperature of 500° C. or higher in said electrode formation step, after the metal material of said electrode has been deposited.

6. The production method of claim 3, wherein the heat treatment is carried out at a temperature of 500° C. or higher in said electrode formation step, after the metal material of said electrode has been deposited.

7. The production method of claim 1, wherein the heat treatment is carried out at a temperature of 600° C. or higher in said electrode formation step, after the metal material of said electrode has been deposited.

8. The production method of claim 3, wherein the heat treatment is carried out at a temperature of 600° C. or higher in said electrode formation step, after the metal material of said electrode has been deposited.

9. The production method of claim 1, wherein the heat treatment is carried out at a temperature of 700° C. or higher in said electrode formation step, after the metal material of said electrode has been deposited.

10. The production method of claim 3, wherein the heat treatment is carried out at a temperature of 700° C. or higher in said electrode formation step, after the metal material of said electrode has been deposited.

* * * * *